(12) United States Patent
Feinberg et al.

(10) Patent No.: US 7,898,254 B2
(45) Date of Patent: Mar. 1, 2011

(54) ARTERIAL SPIN LABELED, SEGMENTED, INTERLEAVED 3D GRASE MRI

(75) Inventors: David A. Feinberg, Bodega, CA (US); Sudhir Ramanna, Sebastopol, CA (US)

(73) Assignee: Advanced MRI Technologies, LLC, Sebastopol, CA (US)

(*) Notice: Subject to any disclaimer, the term of this patent is extended or adjusted under 35 U.S.C. 154(b) by 178 days.

(21) Appl. No.: 12/389,204

(22) Filed: Feb. 19, 2009

(65) Prior Publication Data

US 2009/0212773 A1    Aug. 27, 2009

Related U.S. Application Data

(60) Provisional application No. 61/066,222, filed on Feb. 19, 2008, provisional application No. 61/098,531, filed on Sep. 19, 2008, provisional application No. 61/102,646, filed on Oct. 3, 2008.

(51) Int. Cl.
*G01V 3/00* (2006.01)

(52) U.S. Cl. .................................................... 324/309

(58) Field of Classification Search ......... 324/300–322; 600/407–445
See application file for complete search history.

(56) References Cited

U.S. PATENT DOCUMENTS

| | | | |
|---|---|---|---|
| 5,779,636 A * | 7/1998 | Kanazawa | 600/410 |
| 6,564,080 B1 * | 5/2003 | Kimura | 600/410 |
| 6,717,405 B2 * | 4/2004 | Alsop | 324/306 |
| 6,919,428 B2 * | 7/2005 | Davis et al. | 530/350 |
| 6,980,845 B1 * | 12/2005 | Alsop | 600/410 |
| 7,545,141 B2 * | 6/2009 | Kimura | 324/306 |
| 7,545,142 B2 * | 6/2009 | Alsop | 324/306 |
| 7,587,233 B2 * | 9/2009 | Wong et al. | 600/419 |
| 7,627,360 B2 * | 12/2009 | Kimura | 600/419 |
| 2003/0193334 A1 * | 10/2003 | Alsop | 324/306 |
| 2008/0208033 A1 * | 8/2008 | Alsop | 600/411 |
| 2008/0269595 A1 * | 10/2008 | Wong | 600/411 |
| 2009/0149733 A1 * | 6/2009 | Guenther | 600/410 |

* cited by examiner

*Primary Examiner*—Brij B Shrivastav
(74) *Attorney, Agent, or Firm*—Cooper & Dunham LLP

(57) ABSTRACT

A magnetic resonance imaging (MRI) method of obtaining MRI images of a patient and storing the images in physical storage media.

2 Claims, 13 Drawing Sheets

Single shot 3D ASL GRASE pulse sequences

ARTERIAL SPIN LABELED, SEGMENTED, INTERLEAVED 3D GRASE MRI

REFERENCE TO RELATED APPLICATION

This application incorporates by reference and claims the benefit of U.S. provisional applications Nos. 61/066,222 (filed Feb. 19, 2008), 61/098,531 (filed Sep. 19, 2008) and 61/102,646 (filed Oct. 3, 2008).

BACKGROUND AND SUMMARY

Gradient and spin echo (GRASE) is a pulse sequence that makes images with high signal sampling rates for medical magnetic resonance imaging (MRI). Long echo trains maintain relatively high signal amplitude due to the presence of several 180° RF refocusing pulses that cause signal decay by T2 in spin echoes and by stimulated echo magnetization pathways. The number of refocused echoes in GRASE can easily exceed 500 echoes and, with so many signals obtained from one RF excitation pulse, they can be used to obtain high spatial resolution in single-shot 2D images. A single-shot image is an image made from a single echo train and from a single excitation RF pulse. The long echo trains of GRASE can also be used to make single-shot 3D images by means of additional phase encoding pulses on a second gradient axis. The bandwidth of the phase encoding gradient axes depends on the time interval between sampled points in k-space. With the RF spin echo refocusing between each 2D k-space sampling, the time sampling on the second phase encoded axis is constant and has no evolution of phase errors and therefore no bandwidth related variations in phase error due to Bo inhomogeneity, susceptibility and other off-resonance phase errors that may be present and constant in the data acquisition. The phase encoded image axis of the EPI gradient refocused signals does have bandwidth dependent phase errors, identical to a 2D EPI echo train sequence. Therefore the image distortions and signal loss in regions of high susceptibility are artifacts present in 3D GRASE images.

The phase errors in the 3D GRASE images can be reduced by sampling data at a higher bandwidth, and smaller echo time interval within the gradient refocused echo train between the RF pulses. With the shorter time evolution of phase errors, the artifacts and distortions are reduced; however, this improvement is only up to a point determined by increasing the frequency of gradient switching. The physiologic stimulation of peripheral nerve activity is a biological limitation of gradient switching and increasing the frequency of gradient refocusing of signals. Therefore, on a current generation MRI scanner from Siemens used by at least one of the named inventors, a minimum of 600 microseconds time interval between echoes is typical limit before physiologic stimulations occur or are a consideration. Even at this rapid echo refocusing, there are considerable distortions in regions of the brain near the frontal sinus containing air with high susceptibility, and signal loss occurs there and in the lower temporal lobes due to bone-brain interfaces of susceptibility phase errors in signals.

We have discovered that the combination of segmented 3D GRASE with arterial spin labeling (ASL) has unexpected and great advantages over other 3D ASL techniques including spiral, EPI, TSE and RARE. We have discovered that the physiological variations in cardiac pulsations in cerebrospinal fluid (CSF) and of arterial blood flow do not introduce artifacts into the segmented 3D GRASE sequence. We have also discovered that the blood oxygen level dependent (BOLD) changes can introduce significant variability in signal changes into Spiral and EPI ASL sequences, which can degrade accurate calculation of blood flow in ASL because the T2* encoding is greater in these sequences. However, the GRASE ASL has negligible BOLD encoding because it has spin echo refocusing that nearly eliminates BOLD contamination in the signal. We further discovered that the signal loss in brain regions from susceptibility artifacts is reduced in half or greater in GRASE compared to spiral and EPI. We have discovered that the unique combination of three processes 1) ASL 2) 3D GRASE and 3) multiple segments, when combined together, create the highest speed and quality in blood perfusion images and give an ability to control and reduce the susceptibility artifacts, reduce the T2 dependent blurring and obtain images with fewer signal averages than EPI or TSE segmented sequences and thus obtain higher spatial resolution of blood perfusion in reduced scan times.

Segmented imaging with TSE or RARE is generally slow and inefficient. At present, in our experience ASL using segmented 3D TSE sequences requires 16 minutes to scan while similar spatial resolution in 3D GRASE images requires only 30 seconds using the new combination of segmented data to reduce distortions, blurring, and raise signal-to-noise ratio (SNR). To our knowledge, segmented 3D GRASE has been utilized prior to this work for anatomical images but not for blood flow image and it encountered problems and image artifacts due to movement of CSF which had different velocity dependent phase errors due to different cardiac phase timing in different segments encoded in different excitation cycles of the sequence. These motion dependent amplitude and phase variations in vessels and CSF create severe ghost artifacts which obscure the true image and make it poorly interpretable. The Spiral sequence has specific advantage in eliminating these phase errors, as is well known from its use in cardiac imaging and from functional MRI. Spiral encodes the central region of k-space, where the greatest signal energy occurs in k-space, utilizing the beginning of the Gr gradient oscillation where there is no gradient or minimal gradient amplitude and it is the product of spin velocity and gradient amplitude which contributes to the velocity dependent phase errors, therefore with minimal gradients utilized there is negligible velocity phase error. Therefore, Spiral ASL sequences have shown minimal ghosting artifacts, however, unlike GRASE where the center of k-space and maximum signal occurs after several repeated Gr gradient pulses which accumulate velocity phase errors. But we have discovered that in ASL GRASE, the initial 180° blood labeling pulse stores all signals in the longitudinal plane, so the blood and CSF signal is stored on the longitudinal axis and does not accumulate any phase errors. Also, the background tissue suppression pulses utilized in ASL sequences only reduce signal from stationary tissues and from the CSF, but it doesn't remove these phase errors. The use of an inversion pulse to label blood prior to the readout GRASE sequence allows blood to enter the volume of tissue, regardless of the pulsatility effects, and so the volume of blood within a voxel of tissue is not affected by arterial variations in blood flow. Both the CSF and stationary brain tissue signals are subtracted to zero, nulled, by subtracting a non labeled from a blood labeled image in ASL. We have discovered that this combination of ASL and GRASE allows the use of segmented data either acquired within the same excitation echo train, or from multiple echo trains each acquired with separate excitation pulses, essentially without degradation due to pulsatility artifacts and ghosts from velocity phase shifts. Normally the EPI gradient echoes in GRASE are the source of velocity dependent phase shifts that differ in different phases of the cardiac cycle, each differently effecting the different excitations, so that there can be large discontinuities in phase errors in the final combined k-space data set. In contrast, the combination of ASL with the background suppression and 3D GRASE provides images that can be made with a large number of gradient echo signals to reduce the scan time and raise SNR. This reduction of scan time is not present in segmented EPI or segmented TSE sequences because these sequences are much less efficient and cannot obtain a large number of signals in each segmented data set.

Previously, we and other scientists have combined single echo trains of 3D GRASE with ASL because the segmented 3D GRASE anatomical images without using ASL had artifacts from blood motion and CSF motion which are encoded with different phase errors on different excitations. For this reason, the ability to successfully combine multiple segments of k-space from separately excited echo trains in ASL 3D GRASE appeared to have no practical value due to well known artifacts, and to our knowledge has not been used for imaging.

The advantages of ASL 3D GRASE over 2D EPI is more signals, reduced distortions, reduced artifacts, higher SNR, and less scan time.

Compared to 3D Spiral ASL imaging, the invention 3D ASL GRASE has higher SNR, and does not have the severe susceptibility artifacts of signal loss in Spiral because GRASE centers that k-space on spin echoes where there is no susceptibility artifact, unlike Spiral imaging which places the echoes forming the center of k-space on one side of the gradient signal encoding waveform which is on a gradient echo time so there is T2* and susceptibility error that causes large susceptibility signal drop-out and image artifacts.

3D Spiral RARE ASL (also called 3D Spiral TSE ASL) has efficiency advantages similar to segmented 3D GRASE ASL, however, it places the beginning of the spiral which is the center of k-space, onto a gradient echo position at the beginning or end of each time interval between the RF refocusing pulses. This causes susceptibility artifacts in the image associated with the spiral positioning, and it also creates a non-linear signal change due to T2* BOLD contrast mechanisms which cannot be separated from the ASL signal, preventing accurate quantitative measurements of CBF. The 3D spiral TSE ASL has T2* BOLD signal changes because the ko data has much higher signal than outer regions of k-space and the ko is at the beginning of the spiral where there is T2* contrast, unlike 3D GRASE ASL in which the ko is positioned at the center of the RF pulse interval, on a SE which has T2, not T2* contrast mechanisms. The key to success of 3D GRASE has been its high SNR, low artifact load due to the CPMG timing, and whole brain coverage made possible with the simplified physiological timing in 3D acquisitions.

Compared to 3D EPI, the new invention provides more signals for higher SNR and reduced scan time, and much less distortion and blurring. It is important to note that when two single-shot sequences are interleaved, as in segmented 3D acquisitions, this would reduce artifacts from differences in velocity dependent phase shifts with the two echo trains occurring at different points in the cardiac cycle with different CSF and blood velocities.

Compared to 3D TSE, the new invention provides much more signal, higher SNR, greatly reduced scan time, with similar distortions and blurring and similar artifacts from susceptibility. The efficiency of obtaining a large number of signals in each 3D GRASE echo train reduces the scan time significantly. ASL images have very little signal due to the fraction of blood being a small percent in the tissue, typically 3 to 5% with signal reduced proportionally. The larger number of signals in 3D GRASE raises the image SNR and therefore reduces the number of redundantly encoded signal that are averaged to obtain sufficient SNR to make a resolvable image. Compared to 3D TSE or 3D EPI sequences, the GRASE sequence provides more signals per unit time.

The new approach includes interleaving two or more echo trains from different segmented excitations or from adjacent RF periods in k-space, resulting in half the accumulated phase errors in k-space. Phase errors are reduced in echo trains by reducing RF pulse spacing. Interleaving of the signals from two or more shorter segments of echoes centered on spin echoes in separate RF excitation periods or in refocused periods within a single echo train, are interleaved in k-space to give 3D data sets.

DRAWING

FIG. 1a illustrates pulse sequence timing in 'pulsed arterial spin labeling' (PASL) single shot 3D GRASE, ss-slice selective RF (control), ns-non-selective RF labels spins in inflow vessels (label), (black) background suppression of static signal in brain, and (blue) modulated suppression of outer-slab regions.

FIG. 6 illustrates interleaving (curved arrow) of sequential pairs of short echo trains between RF refocusings. With the difference in k-space order, the ko center of kp axis is encoded in different RF periods. With averaging of these two differently ordered kp in two single shot 3D echo trains, there is averaging of different T2 amplitude which eliminates the periodic T2 dependent modulation which causes image ghost artifact.

FIG. 9 illustrates one of several possible variants of the novel interleaved 2D EPI sequence. The sequence could also be performed without the 180° pulse and require additional phase error correction with conventional methods using additionally acquired 'phase correction data' which has no Gp phase encoding. The accumulative T2* phase errors are reduced by half from conventional EPI. The interleaved echo train can be acquired without the selective 180° degree RF (removal of group of the 2 G-slice spoiler and selective gradient pulses and RF pulse centered on vertical line). The Hahn SE time is shown but echoes are acquired earlier to obtain T2* weighted images which can be used for fMRI with BOLD contrast.

DETAILED DESCRIPTION

Figure 1A:
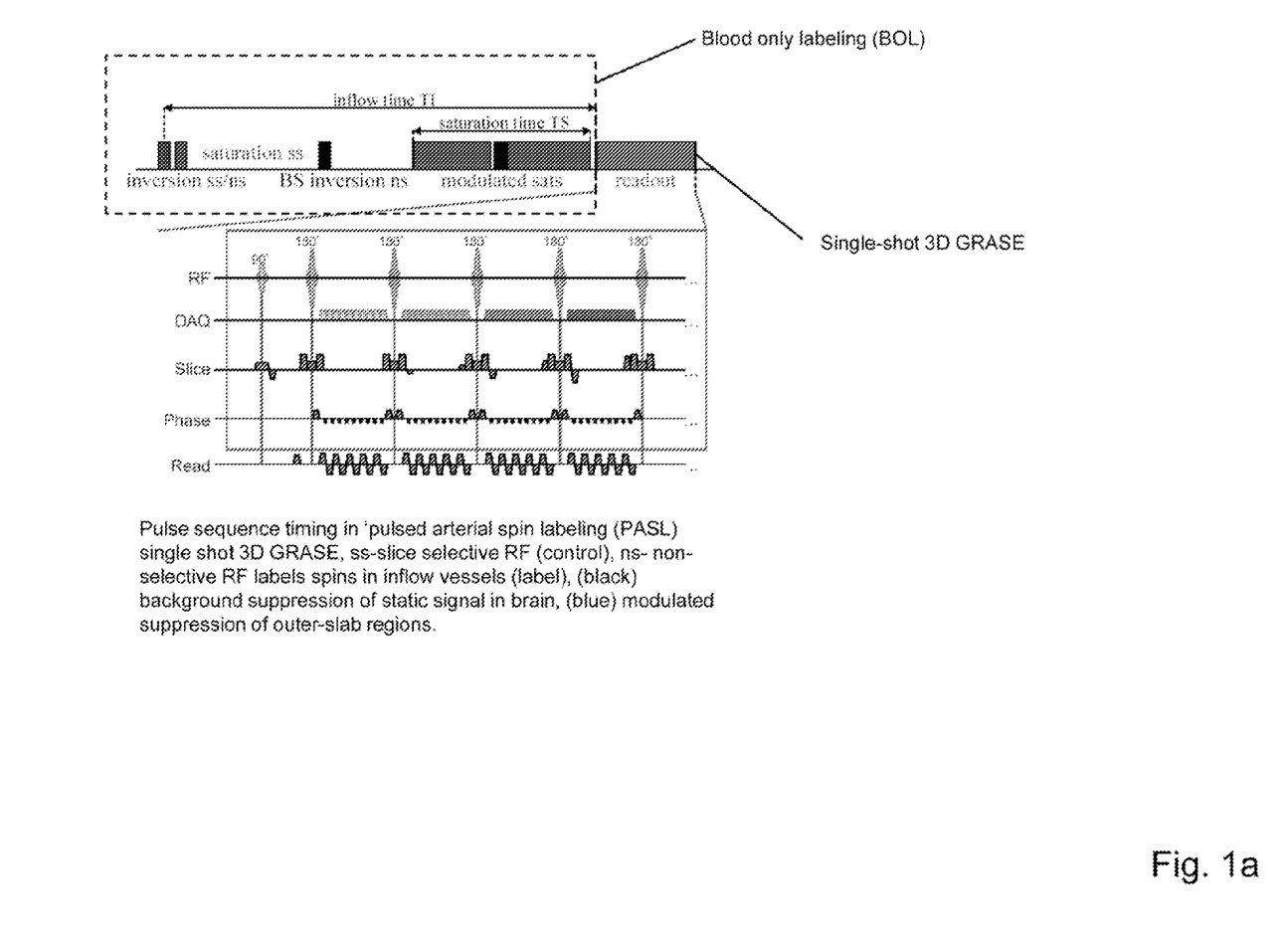
FIG. 1a illustrates arterial spin labeling in a single shot 3D GRASE in which the 'blood only label' (BOL) pulses include background suppression pulses, ASL pulses, and QUIPS II pulses to saturate unwanted spins outside of the 3D volume. More particularly.
Figure 1B:
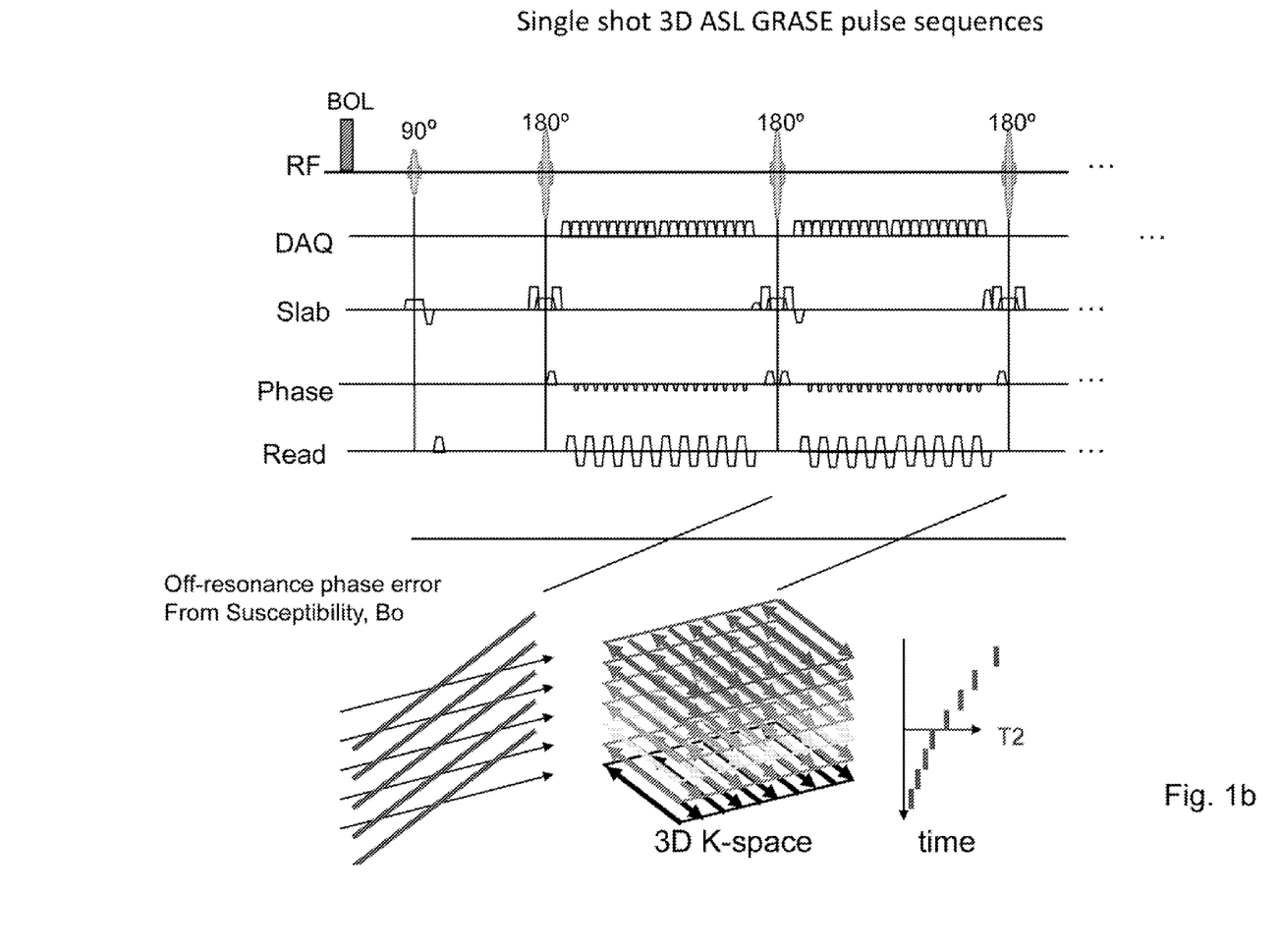
FIG. 1b illustrates Phase errors accumulating between RF pulses projected into the kp axis of 3D k-space.
Figure 2:
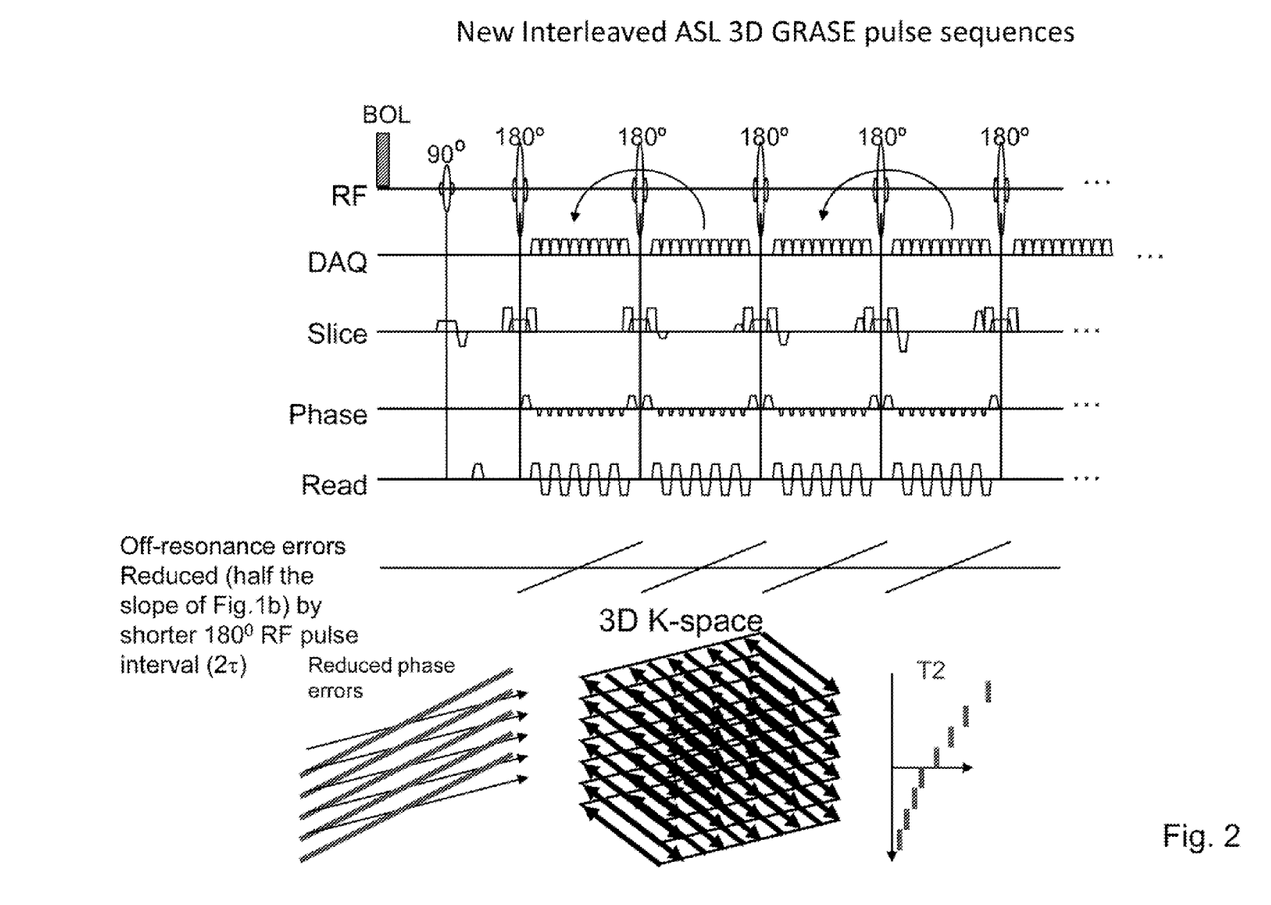
FIG. 2 illustrates interleaved ASL 3D GRASE pulse sequences (curved arrow) of two echo trains from adjacent RF periods in k-space resulting in half the accumulated phase errors in k-space (stacked graphs on left side of k-space diagram) compared to single shot 3D GRASE.
Figure 3A:
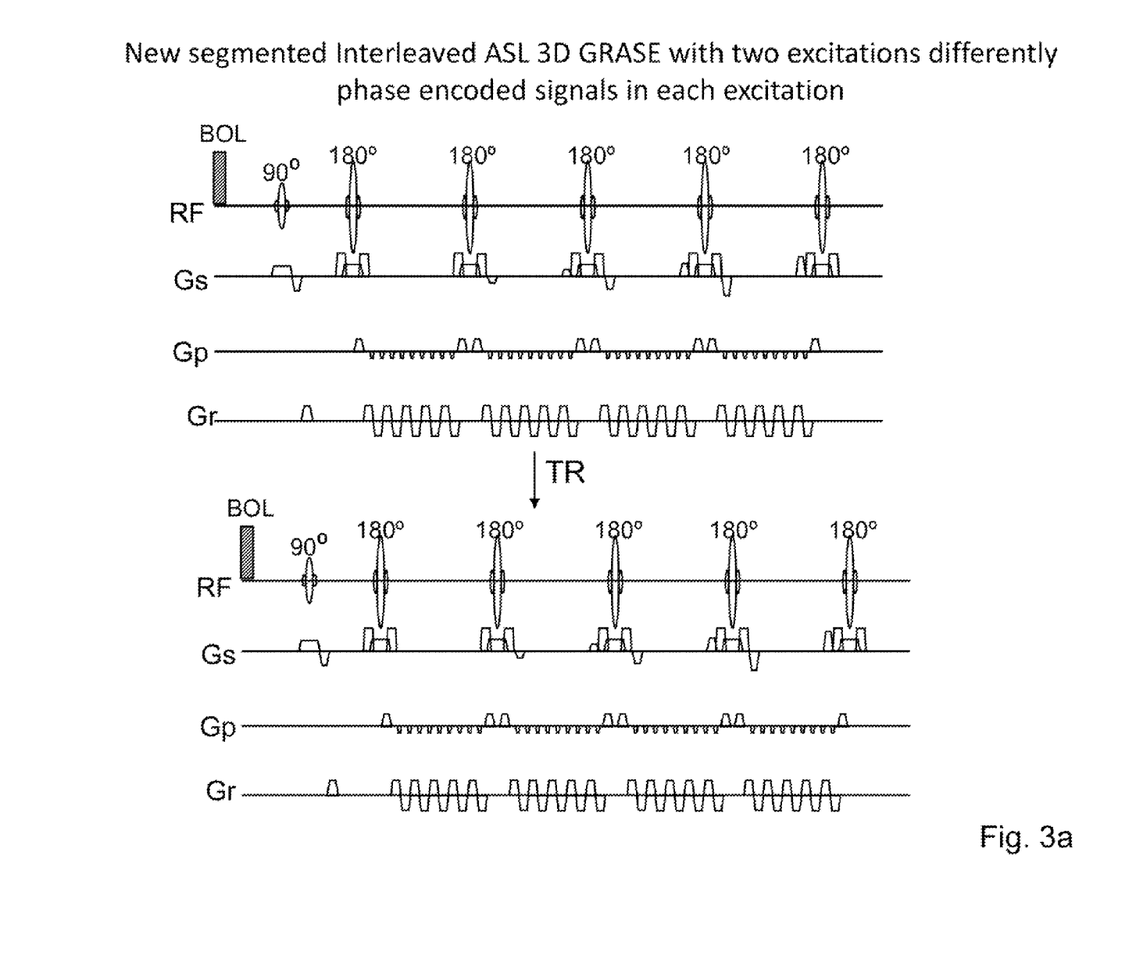
FIG. 3a illustrates the new, segmented interleaved ASL 3D GRASE pulse sequence with excitations differently phase encoded in each excitation.
Figure 3B:
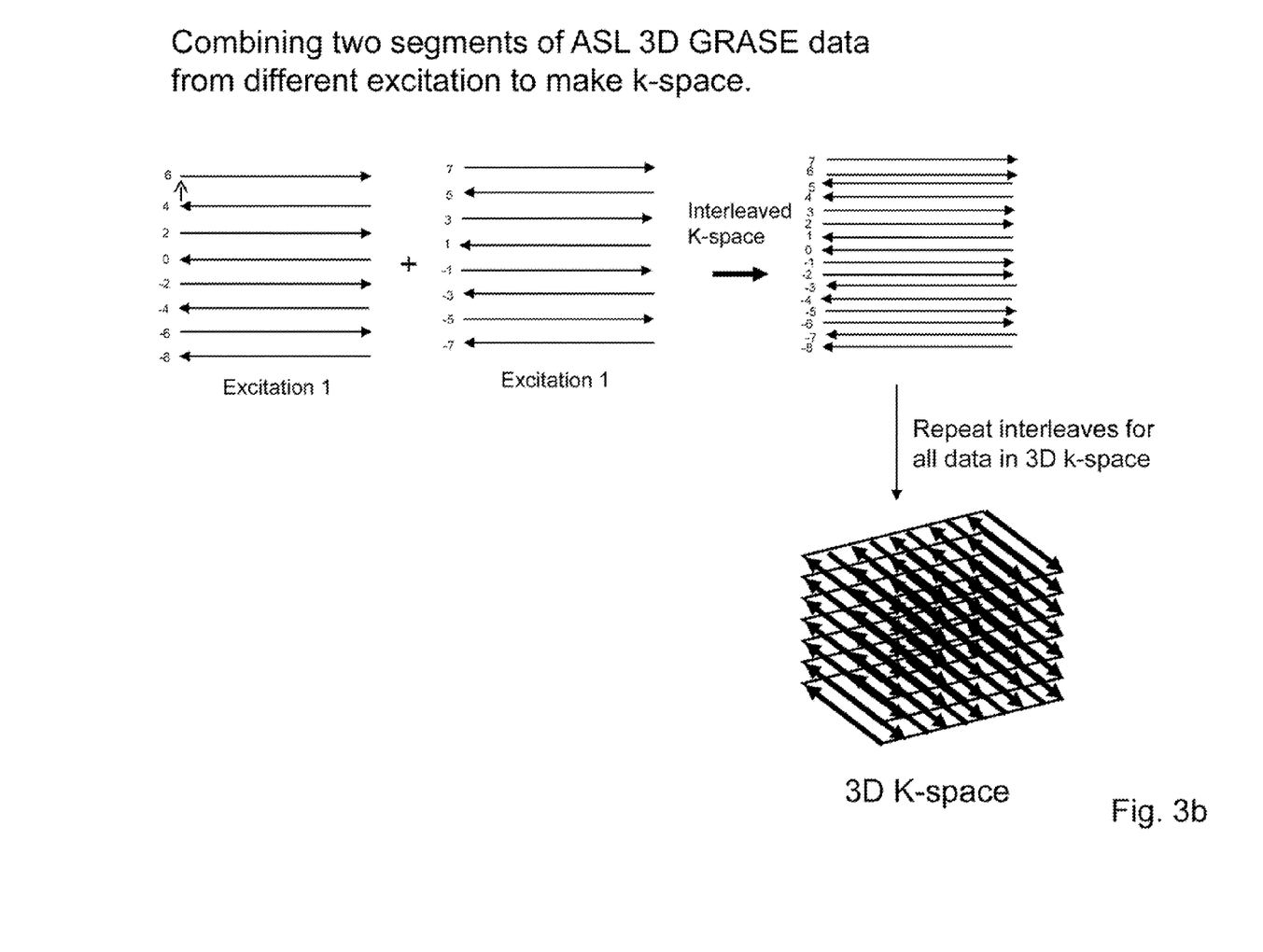
FIG. 3b illustrates the combining of two segments of ASL 3D GRASE data from different excitations interleaved to make k-space. The different phase encode gradient values shown by numbers, are repeated on each Gs-slice encoded axis which has additional Gslice phase encoding for $3^{rd}$ dimension of k-space.
Figure 4A:
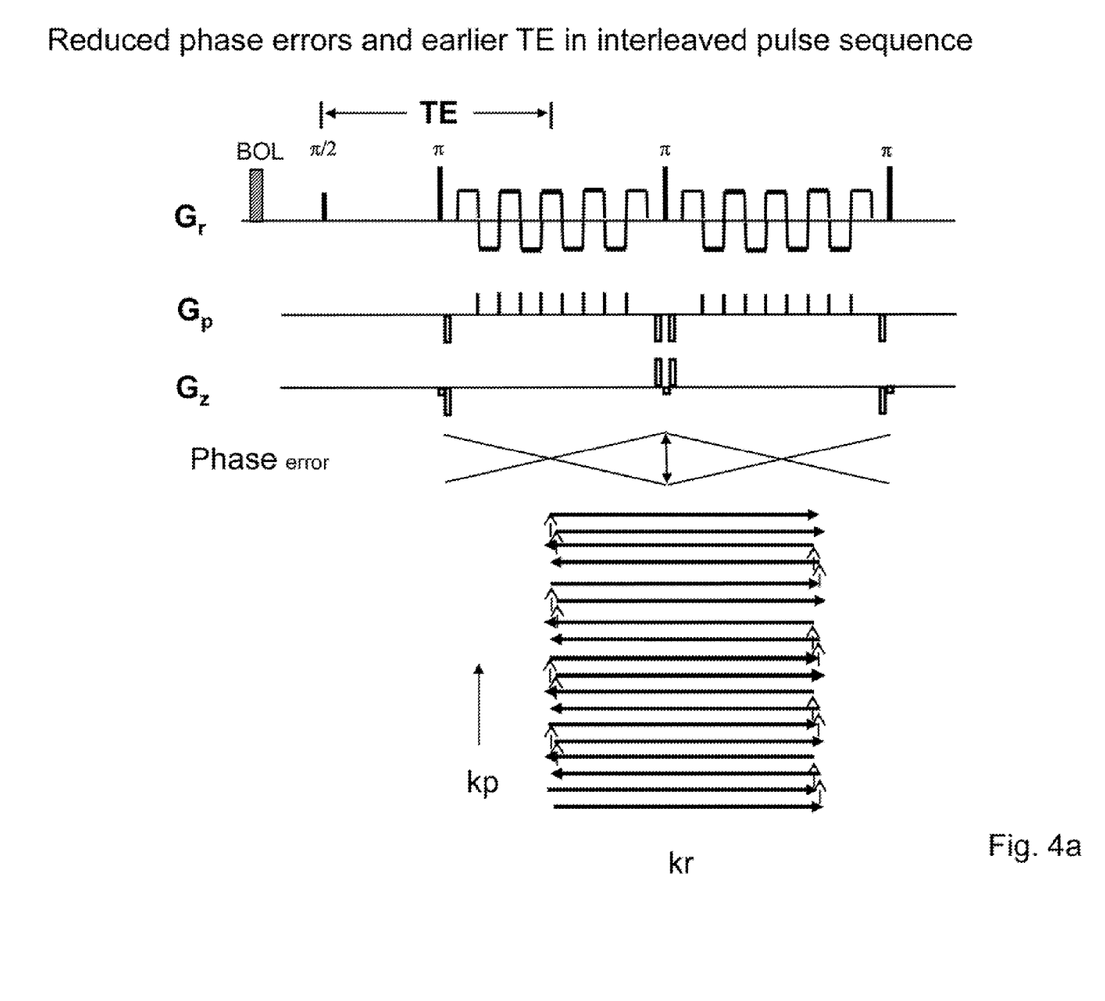
FIG. 4a illustrates reduced phase error and earlier TE in interleaved pulse sequences. 4b) reduced phase errors and shorter TE compared to FIG. 4b illustrates conventional non-interleaved single train of echoes which has twice the amplitude of phase error and a later effective TE, causing greater signal decay and reducing blood signal amplitude and image SNR compared with the new interleaved sequence.
Figure 4B:
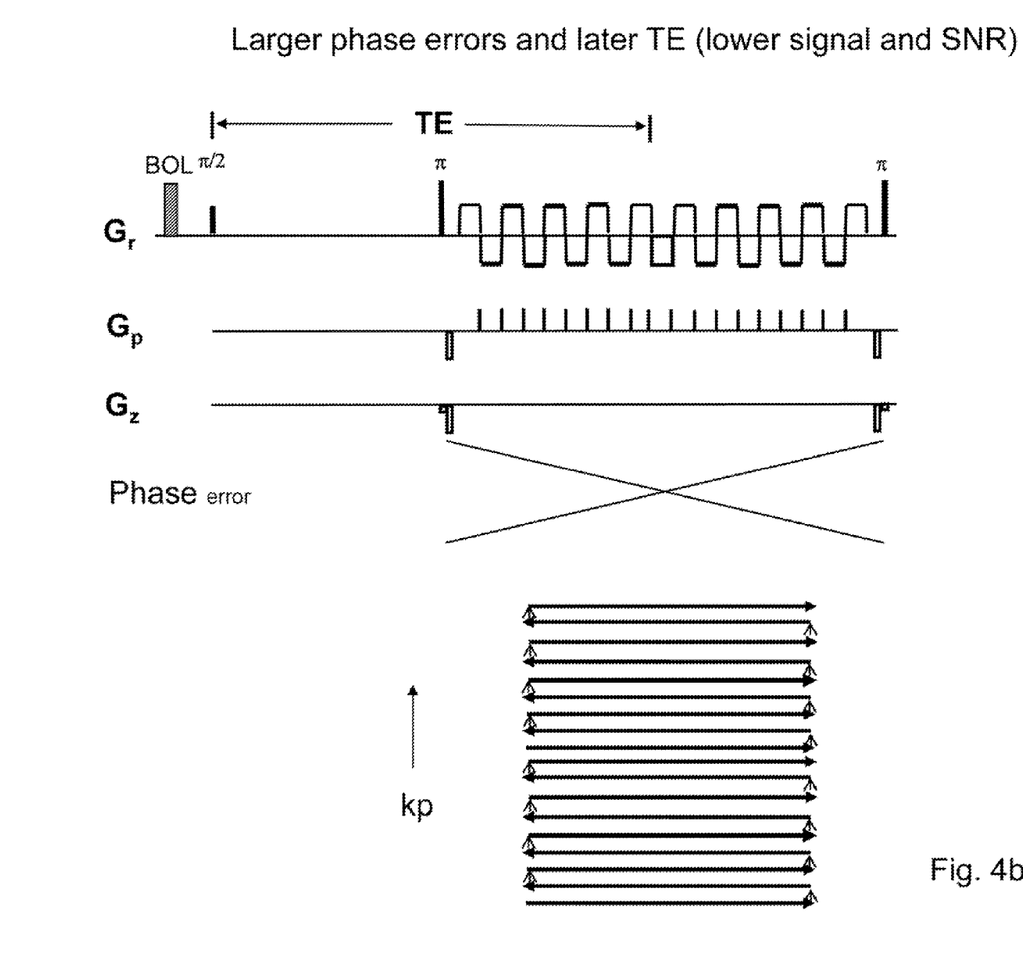
Figure 5:
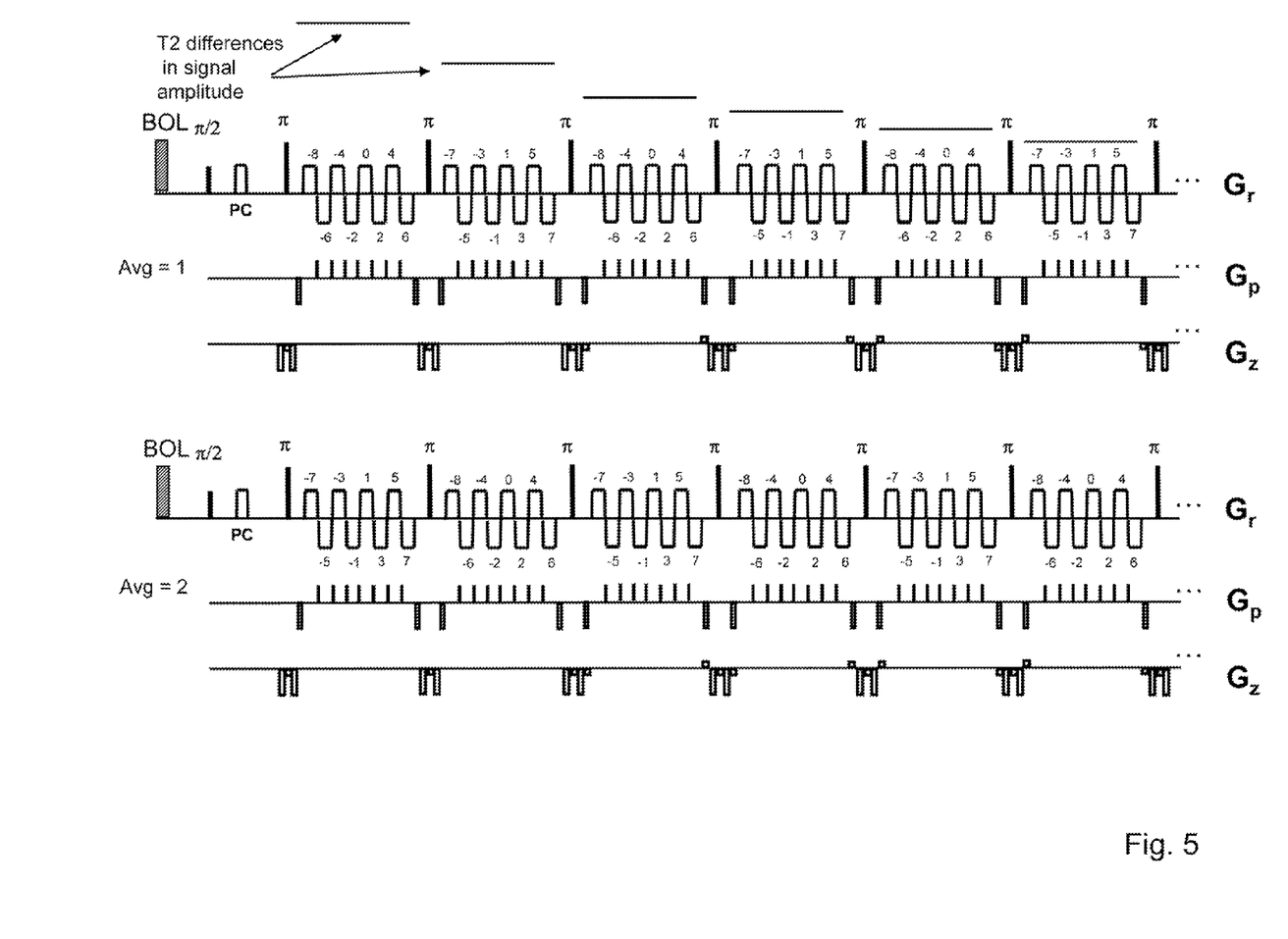
FIG. 5 illustrates T2 decay of signals amplitude in the 3D GRASE echo train. These differences in T2 amplitude result in a periodic amplitude convolved with the phase encoded amplitude function in signal across kp axis of 3D K-space in a single shot data set. In Avg=2, the k-space ordering (numbers −7 to 7) are changed by changing the Gp gradient amplitudes, otherwise the Gr and Gz gradients are identical in Avg 1 and Avg 2.
Figure 6:
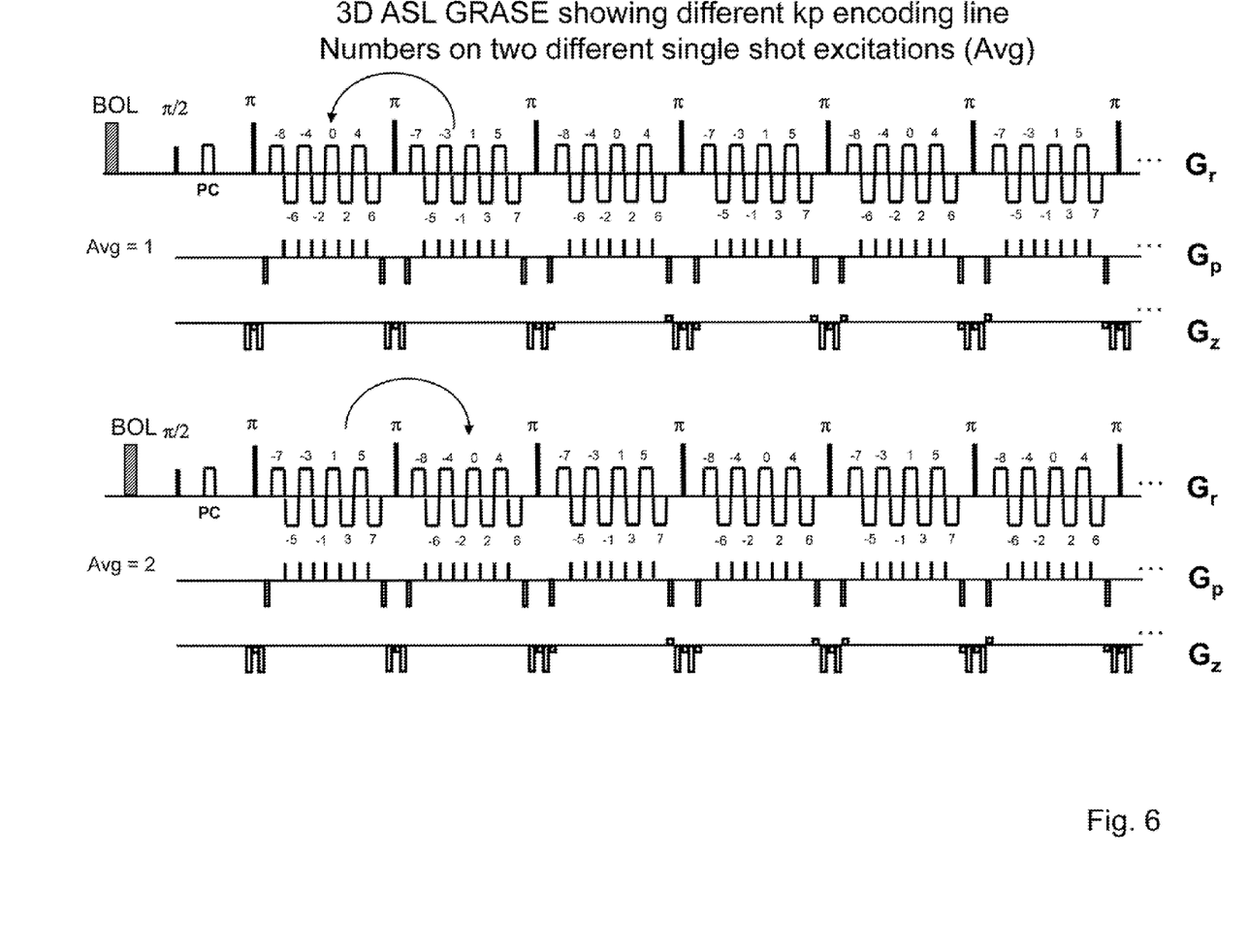
Figure 7:
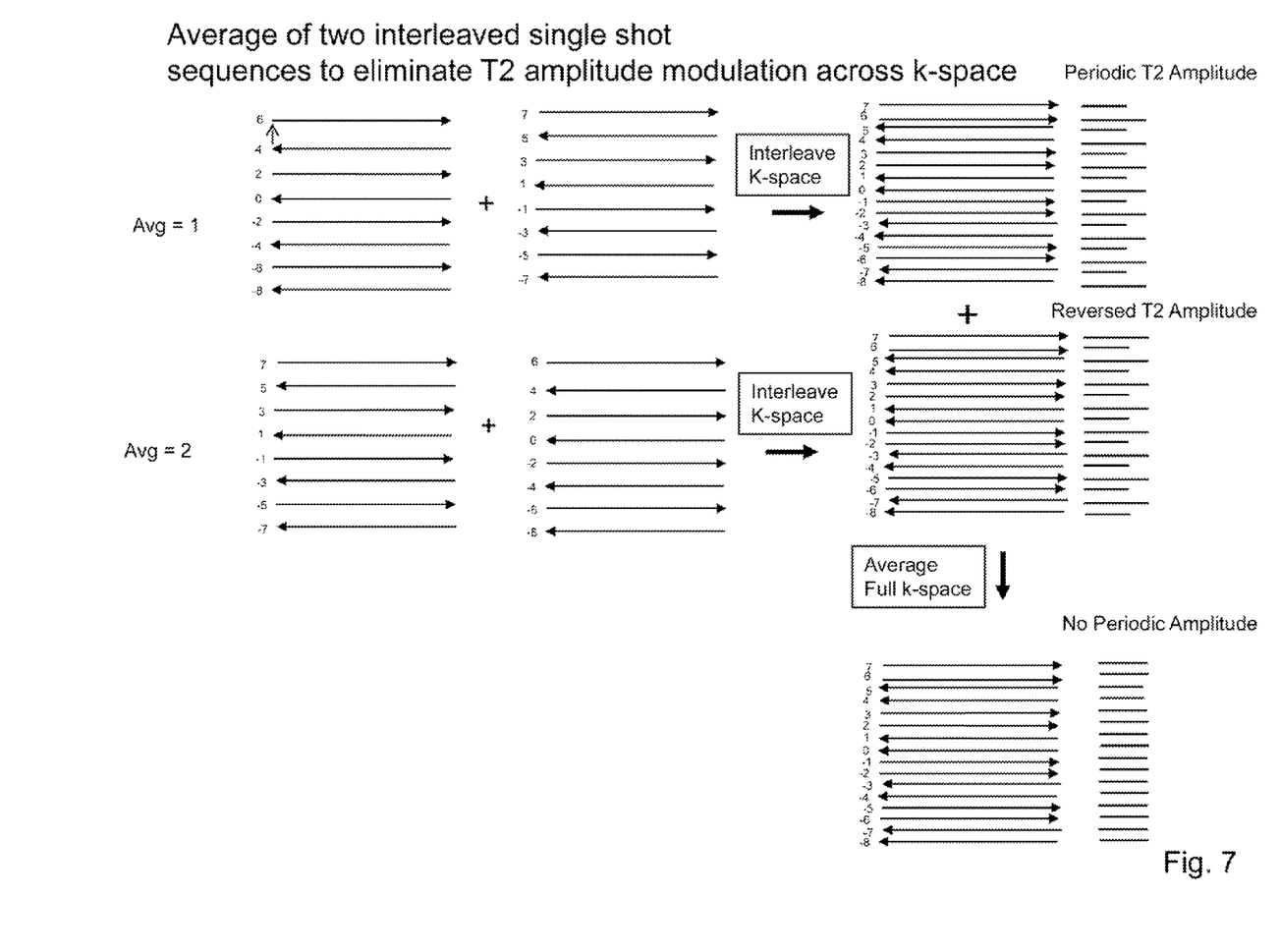
FIG. 7 illustrates from Left to Right, averaging of two echo groups from two adjacent RF periods to accomplish reduced T2* phase errors. The T2 amplitudes are periodic and of reversed order in two different signal excitations (Avg 1 and Avg 2) single shot echo trains. The combination by complex addition or complex averaging of the k-space data sets causes averaging of T2 amplitude differences and elimination of the periodic T2 function on kp to eliminate ghosting artifacts in images.
Figure 8:
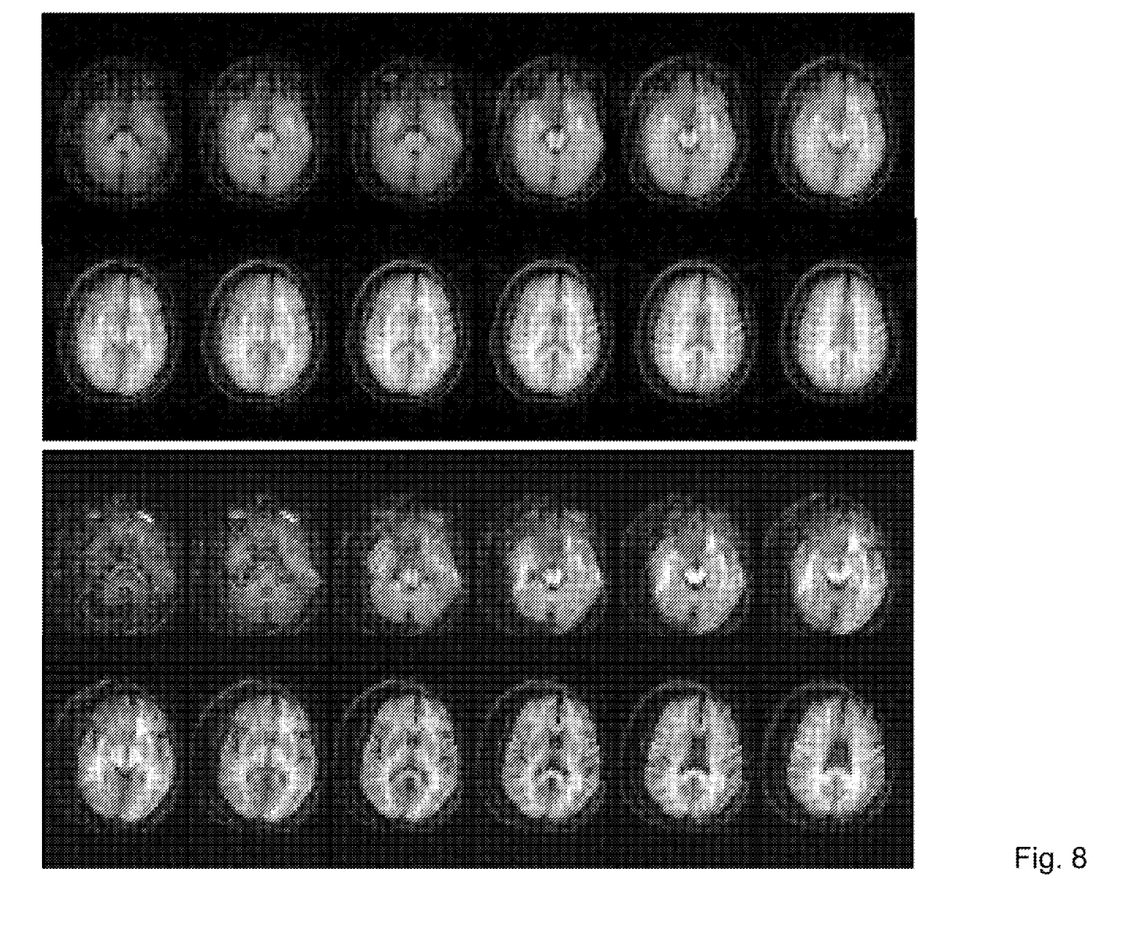
FIG. 8 shows ASL images of brain acquired with the interleaved single shot ASL 3D GRASE sequence (top 2 rows) and corresponding images at same brain slice levels using the old non-interleaved sequence (bottom 2 rows). The interleaved images have higher signal and SNR due to earlier TE due to shorter RF pulse spacing and earliest ko time. The interleaved images have less signal drop out (blackening) in regions of high susceptibility at the base of the brains temporal lobes and in frontal lobes from susceptibility in paranasal sinuses (top row, left 3 images). There is less brain distortion and less chemical shift of scalp (outer rings displaced) in interleaved images due to higher effective bandwidth on kp axis and reduced maximum variation in phase.
Figure 9:
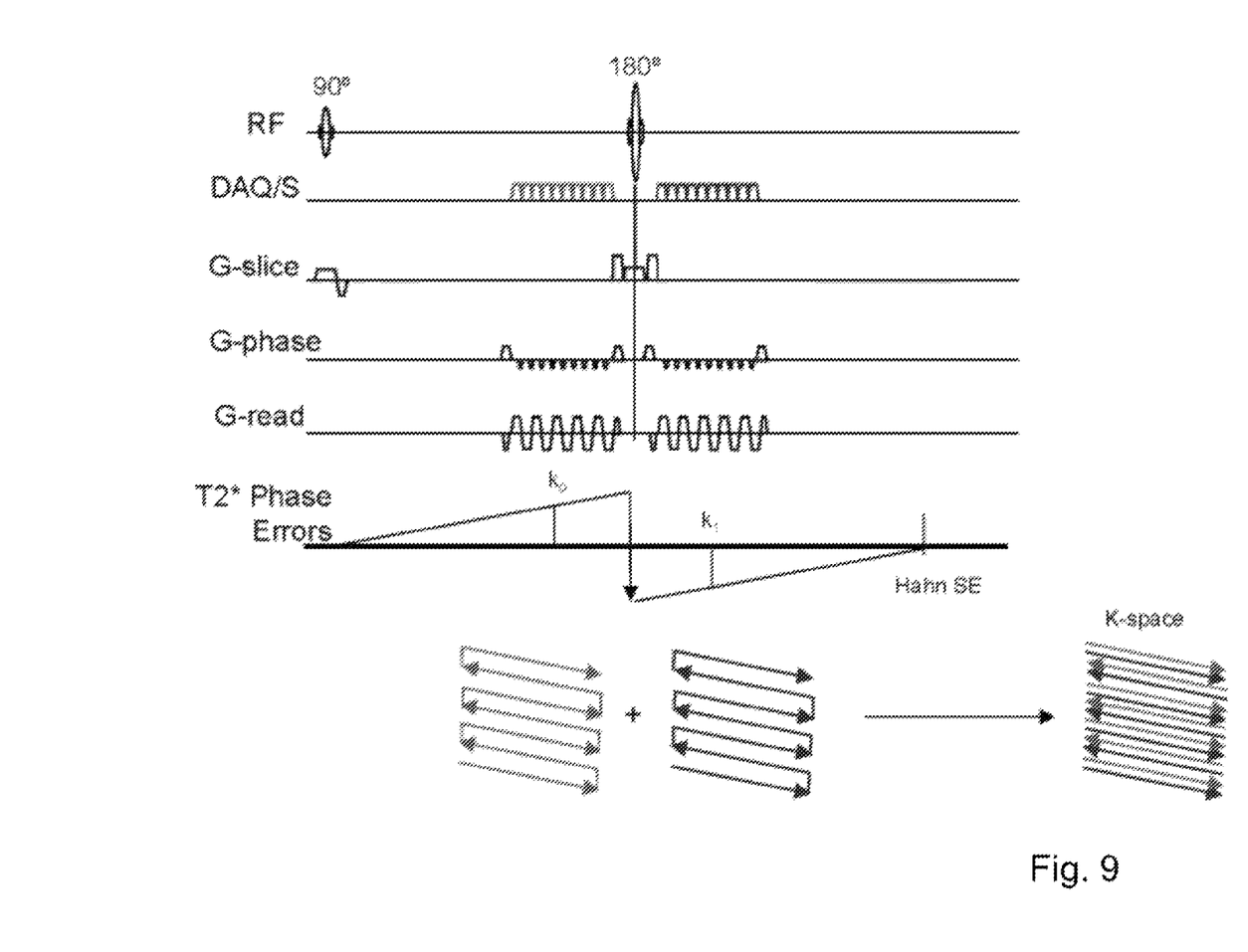
Figure 10:
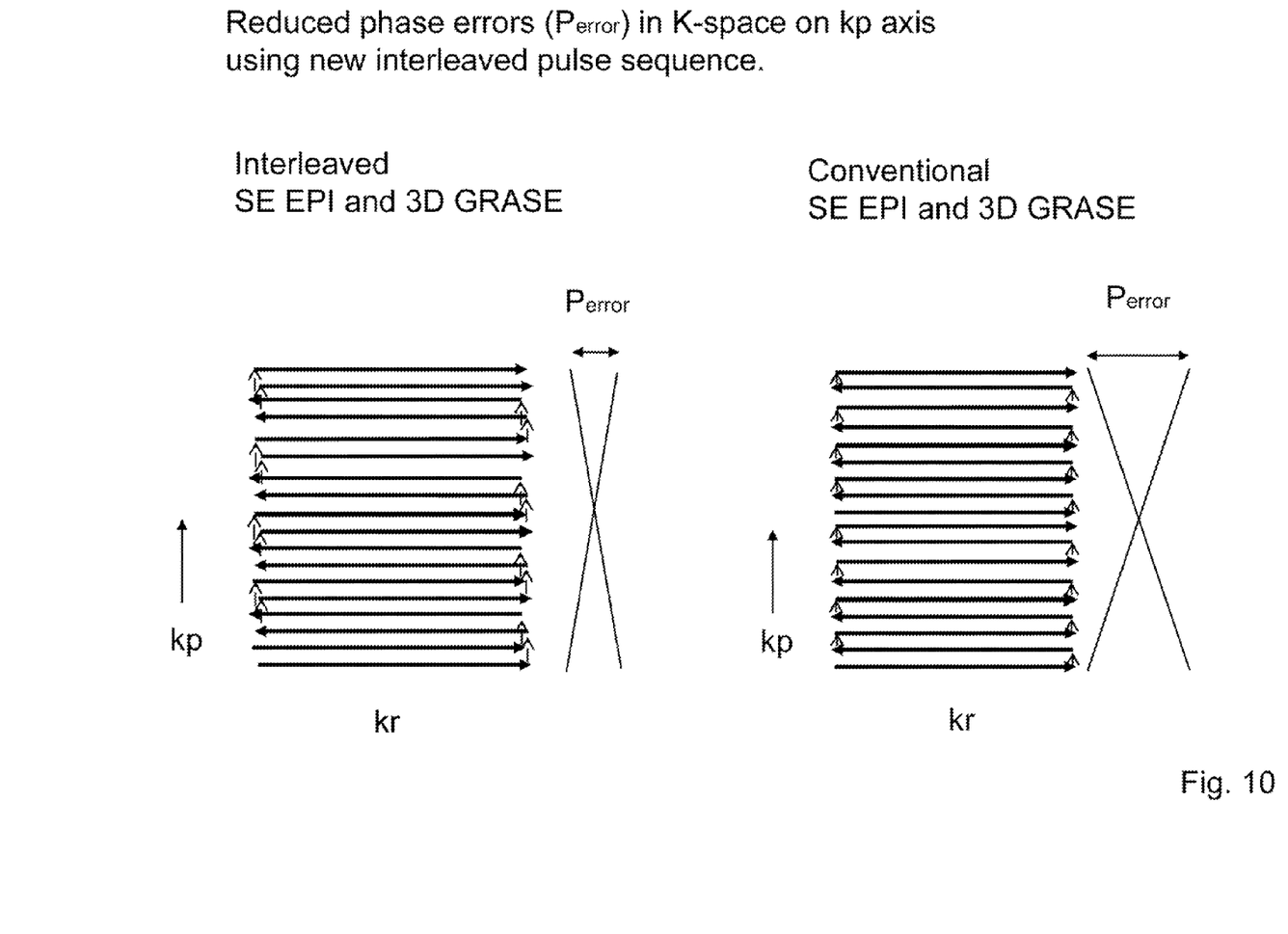
FIG. 10 illustrates a reduction of phase errors ($P_{error}$) in k-space on kp axis comparing (left) interleaved SE EPI and 3D GRASE with (right) conventional SE EPI and 3D GRASE.

A novel approach is described to acquiring 3D images that have reduced distortion and susceptibility artifacts by means of performing steps that in combination have an effect of greatly improving the single-shot and multi-shot 3D GRASE ASL images.

The segmented BOL 3D GRASE sequence requires the acquisition of multiple segments of data with TR between each echo train. The data is used to make two different 3D images, one with blood and static tissue signal and the second 3D image being identical except for difference in blood signal labeling. The two 3D images are subtracted to eliminate the static tissue signal yielding a 3D image of only blood signal.

A) More specifically: 1) the ASL 3D echo train is produced by at least 2 echo trains with recovery time (TR) between the sequences in which at least 2 of the echo trains have identical BOL blood labeling pulses or other effectively similar combinations of gradient pulses and RF pulses (pseudo continuous, continuous, or pulsed ASL forms of BOL labeling pulses) with spatial phase encoded signals in each echo train; 2) Utilizing two or more such segmented echo trains, the different phase encoded signals are interleaved in k-space locations to create a complete 3D k-space; 3) Additional echo trains with different phase encoding gradient pulses in each echo train are acquired at constant TR to create a second 3D k-space with different effective blood labeling pulse; and 4) The 3D FT of these two k-space data set yields two 3D images which are then subtracted or combined to give a calculated 3D image which shows only blood.

B) In single-shot 3D images, the following steps can be carried out to interleave the data.

1) the ASL 3D echo train is produced with EPI echo trains between the RF pulses so that the phase encode gradient is incremented to under-sample the k-space Kp axis, so that full spatial resolution is achieved with aliasing artifact from insufficient field of view on the image axis.

2) The ASL echo trains in the adjacent next RF pulse time intervals has k-space phase encoding which is offset by a single k-space line compared to the previous echo train.

3) The two adjacent echo trains with single k-space line offset in encoding, are interleaved in k-space so that they fully cover k-space with full spatial resolution and full field of view that eliminates aliasing artifact. The interleaved k-space satisfies the Nyquist sampling frequency. The interleaved signals have intrinsic differences in amplitude resulting from different timing in the echo train due to different T2 decay at the time of the two adjacent echo trains obtained after each RF refocusing pulse.

4) A second complete single-shot echo train is acquired that is identical to the above described acquisition of 1-3) but with a shifted timing of the k-space sampling of two echo trains so that the intrinsic T2 signal amplitude differences are the opposite of the first acquired k-space. The high amplitude signals become lower amplitude signals, and vice versa in the resulting interleaved k-space data set.

5) The complex data from the first and second excitations are averaged by adding signals of identical k-space encoding resulting in identical T2 and T2* dependent amplitudes in the adjacent interleaved k-space lines. The final averaged k-space data has an equivalent of half the amount of Bo and susceptibility dependent phase errors on the k-space phase encode axis, equivalent to the artifact reduction effect of halving the sampling time interval between echoes in a non-interleaved full 3D k-space.

The distortions and susceptibility dependent signal losses are reduced by half in the interleaved 3D images compared to conventional acquired non-interleaved 3D images. The SNR of the image is increased by the square root 2, due to the averaging of two echo train data sets. The SNR is also increased by means of an earlier effective TE caused by shortening the RF pulse spacing due to the shorter intervening echo trains. Each single-shot sequence acquires all k-space lines in the 3D k-space.

The resulting 3D k-space data that has been interleaved and averaged results in a continuous or stepped variation of T2* dependent phase errors on one k-space axis and a variation in T2 amplitude variation in magnitude of signals on the second k-space axis. The amplitude variations need not be continuous. A conventional 'centric ordering' of data with the highest amplitude signals positioned symmetric about the ko of the k-space axis can be encoded to obtain maximum SNR in images.

The interleaved signals arising from two or more RF refocusing periods have the identical off-resonance phase errors. By reducing the intervening echo train, the RF time intervals can be reduced to shorten the time of the accumulated phase errors in each echo train. When two or more echo trains are interleaved in k-space, the variation of phase errors across the phase encode k-space axis is equal to the time evolution of the shortened echo train. The resulting time interval between k-space sampling points is smaller with adjacent k-space sampling lines having the identical phase errors. To create true linear variation in phase errors across k-space, a small time shift difference in the timing of the two interleaved echo trains is achieved by different timing displacements of the read gradients with respect to the center of the RF refocusing period, when the Hahn spin echo occurs.

The interleaved echo train methodology can be applied to echo planar imaging (EPI) and 3D echo volumar imaging (EVI). By segmenting the EPI and EVI echo trains into several shorter echo trains in which the phase encoding order allows interleaving in k-space, the time evolution of phase errors across k-space phase encoded axes is shortened. The method for EVI would be essentially that of removing the 180 degree RF refocusing pulses from the above described interleaved 3D GRASE sequence. One difference is the shorter echo trains to be interleaved will not have identical phase errors since they do not have spin echo refocusing processes of the off-resonance phase errors. Instead, the phase errors will have large differences between adjacent k-space lines after interleaving, corresponding to the T2* evolution of off-resonance phase errors at the two times at which the k-space lines are sampled in the single-shot echo train, which is the time of each shorter echo train segment to be interleaved. When two single shot segmented EVI echo trains, with the shifted k-space order, are averaged, both the amplitude and phases of the k-space lines will be averaged, and this will reduce variations in phase errors and removing amplitude modulation. The use of a prior knowledge of the phase errors by means of off resonance field mapping obtained by any of several means would also reduce the phase error variations in k-space of interleaved EPI.

The entire process can be extended to multiple (greater than two) interleaves from within a single echo train and multiple averages of single shot echo trains with different k-space orders.

The invention claimed is:

1. A magnetic resonance imaging (MRI) method of obtaining MRI images of a patient and storing the images in physical storage media comprising:
   obtaining a first single shot arterial spin labeled (ASL) three-dimensional (3D) echo train comprising:
      first echo signals resulting from a first set of RF pulses wherein a phase encode gradient is under-sampled, and using said first echo signals to fill in a first set of lines in a first k-space; and
      second echo signals resulting from a second set of RF pulses that are interleaved in time with the first set of RF pulses, and using said second echo signals to fill in a second set of lines in the first k-space interleaved in k-space with said first set of lines;
   obtaining a second single shot ASL 3D echo train in essentially the same manner as the first echo train but with a shifted timing so that intrinsic T2 signal amplitude differences are opposite to those of the first echo train and the first k-space, and using the second echo train to fill in a second k-space such that for lines in matching positions in k-space high amplitude signals for the first k-space are low amplitude signals for the second k-space and vice versa;
   averaging complex data of matching k-space encoding of the first and second k-spaces to create a resulting averaged k-space;
   using the averaged k-space to generate one or more MRI images; and
   storing the MRI images in physical storage media.

2. A magnetic resonance imaging (MRI) method of obtaining blood flow MRI images of a patient and storing the images in physical storage media comprising:
   obtaining multiple segments of blood-only-labeled (BOL) MRI data of the patient with recovery time TR between echo trains of a segmented BOL 3D GRASE pulse sequence;
   computer-processing the BOL MRI data to create first and second 3D MRI images, wherein the first image results from processing MRI data based on blood and static tissue MRI signals and the second image is based on essentially unchanged static tissue signals but differently labeled blood signals;
   computer-subtracting the first and second images to eliminate or reduce the static image content in the resulting subtraction image and thereby create an essentially blood-only MRI image; and
   storing information describing the resulting blood-only MRI image in computer storage media.

* * * * *